US005585886A

United States Patent [19]

Yabe

[11] Patent Number: 5,585,886

[45] Date of Patent: Dec. 17, 1996

[54] APPARATUS FOR PRINTING A PHOTOSENSITIVE MATERIAL AND POSITIONING DEVICE

[75] Inventor: Shin-ichi Yabe, Kanagawa, Japan

[73] Assignee: Fuji Photo Film Co., Ltd., Kanagawa, Japan

[21] Appl. No.: 841,328

[22] Filed: Feb. 25, 1992

[30] Foreign Application Priority Data

Feb. 26, 1991 [JP] Japan .................................. 3-030878

[51] Int. Cl.$^6$ .................................................... G03B 27/52

[52] U.S. Cl. ................................................ 355/41; 355/86

[58] Field of Search ................................ 355/79, 85, 86, 355/87, 88, 95, 41

[56] References Cited

U.S. PATENT DOCUMENTS

| | | | |
|---|---|---|---|
| 3,873,202 | 3/1975 | Inoue | 355/88 |
| 4,372,677 | 2/1983 | Horner | 355/86 |
| 4,435,076 | 3/1984 | Tatsunosuke | 355/41 |
| 4,489,652 | 12/1984 | Takeuchi et al. . | |
| 4,533,239 | 8/1985 | Back . | |
| 4,566,194 | 1/1986 | Tsunoda et al. . | |
| 4,594,868 | 6/1986 | Takeuchi et al. . | |
| 4,916,482 | 4/1990 | Nishida et al. | 355/88 |

FOREIGN PATENT DOCUMENTS

| | | |
|---|---|---|
| 0282246 | 9/1988 | European Pat. Off. . |
| 2091155 | 7/1982 | United Kingdom . |
| 2245374 | 1/1992 | United Kingdom . |
| 8902097 | 8/1989 | WIPO . |

*Primary Examiner*—Howard B. Blankenship
*Attorney, Agent, or Firm*—Sughrue, Mion, Zinn, Macpeak & Seas

[57] ABSTRACT

In a photosensitive material printing apparatus, a film on which an image area indicating mark indicating an area where an image has been recorded, are marked, is positioned at a predetermined position of a photosensitive material to print the image onto the photosensitive material. After punch-holes are punched by a punching device, a position of the image area indicating mark recorded on the film is read by a reading sensor to obtain a relative position between the punch-holes and the image area indicating mark. A film positioning device is moved, according to the relative position obtained by the reading sensor, to a position where the image area indicating mark corresponds to the predetermined position of the photosensitive material to hold the film at the position.

24 Claims, 13 Drawing Sheets

PS Plate Feeding Station
26
E
20
Negative Film Feeding Station
C
Printing Station
D
Printed Negative Film Storing Station
B
F
22
24
18
Punching and Measuring Station
Calculating Station
PS Plate Discharging Station
28
58
A
Negative Film Storing Station
16
10

PS Plate Feeding Station
26
E
Printing Station
22
D
Printed Negative Film Storing Station
24
F
PS Plate Discharging Station
28
10
C
Calculating Station
58
Negative Film Feeding Station
20
B
Punching and Measuring Station
18
A
Negative Film Storing Station
16

16
34
32
40A
40
36
12
38A
38
36A
A
40A 18
42
44
12
46
46A
48
50
50A
54
54A
54B
54C
56
5
6
A
B
X
Y 42
56
54
44
54C
50A
50
48
18
12
50
50A
Y
50
50A
54C
56
54

E
78
78A
78B
78C
60
H
80
NEGATIVE PRESSURE SUPPLYING UNIT 86
88
84
14
C
H
F
108
110
94
90A
22
90C
E
62
120
60
12
Y
82
114A
90B
90D
D
112
14
X
114B 88
86
84
14
90C
E
C
H
F
110
108
Y
12
62
120
82
114A
60
90D
112
14
D
114B
X 62
93(92)
93B(92B)
93A(92A)
88
68
66A
66
128
126
64
64A
96B
98
73
96A
72
100
105
120
107
95(94)
95A(94A)
66A
66
64A
12
22
X
14

D
C
12
120
52C
122
106
104
92
100
100A
102
92B
66A
64
64A
88
128
126
70
71
64A
70C
52B
124
74
70A
70B
Y
73
62
100
100A
102
93B
72
93
52A
122
107
105
64A
100A
102
128
126
68
66A
66

APPARATUS FOR PRINTING A PHOTOSENSITIVE MATERIAL AND POSITIONING DEVICE

BACKGROUND OF THE INVENTION a) Field of the invention

The present invention relates to an apparatus for printing an image recorded on a film onto a photosensitive material, and particularly to an apparatus for printing an image onto a photosensitive material, after a film is positioned at a predetermined position on the photosensitive material, and to a device for positioning the film.

b) Description of the Related Art

An image recorded on an original film (hereinafter referred to as a negative film) is printed onto a lithographic printing plate, which is used in a rotary press or the like for printing newspaper, or a photosensitive material such as a photosensitive material for preparing a color proof (hereinafter referred to as a PS plate) by means of an apparatus for printing a photosensitive material (hereinafter referred to as a printing apparatus for printing plate).

A surface plate is disposed at the printing station of this printing apparatus for printing plate. A PS plate supplied onto the printing apparatus by means of a PS plate feeding apparatus is placed on the surface plate at a predetermined position. At this time, the negative film is placed while being positioned or registered at a predetermined position of the PS plate. In this positioning, a protrudent portion, for example, a pin or the like, is provided on the surface plate, and is inserted into a hole formed in the negative film to register the negative film. In addition, this positioning is conducted on the basis of the position o f an image area indicating mark (hereinafter referred to as a register mark) marked on the negative film.

High accuracy is required for the positioning of the negative film on the PS plate. After the negative film is placed on the PS plate, it is further necessary to finely adjust the position of the negative film.

In addition, in particular, in color printing, if separation negative films, corresponding to four color separated images of yellow, magenta, cyan and black, are used, it is necessary to separately print the images of the four separation negatives onto the PS plate. Therefore, according to the above-described positioning method, the color-separated image of the negative film is printed onto the PS plate four times, in which accurate positioning of each negative film is required. Namely, the negative films are required to be accurately registered on the PS plate to be printed so as not to cause color shift in a color image printed by superposing these four color images.

However, according to the above-described printing apparatus for printing plate, since the positioning of the negative films is conducted after the negative films are placed on the PS plate, the positioning process requires tens of seconds. Accordingly continuous printing of a plurality of negative films is time-consuming. In addition, it is necessary to use an identical printing apparatus, in order to prevent the color shift of the color image due to dimension of a positioning error among the printing apparatuses for printing plate, which in turn complicates the printing work and may effect the working efficiency.

SUMMARY OF THE INVENTION

In view of the above-described circumstances, an object of the present invention is to provide an apparatus for printing a photosensitive material and a positioning apparatus which facilitates positioning or registration of the negative films onto the photosensitive material, and substantially eliminates errors due to dimension of a positioning error among apparatus.

According to the present invention, there is provided a photosensitive material printing apparatus for printing an image recorded on an original film onto a photosensitive material in which the original film, having an image area indicating mark for indicating the area of the image recorded on said film, is registered on the photosensitive material in such a manner that the image area indicating mark corresponds to a predetermined position of the photosensitive material. The photosensitive material printing apparatus has a reference position marking means for marking a reference position in the film, and a reading means for reading a position of the image area indicating mark to obtain a relative position between the image area indicating mark and the reference position. The photosensitive material printing apparatus also has a film positioning means capable of moving and holding the film to a position where, the image area indicating mark corresponds to the predetermined position of the photosensitive material, according to the relative position obtained by the reading means.

According to the above-described arrangement of the present invention, a reference position for positioning is marked in a predetermined position of an original film in advance by the reference position marking means. In addition, an image area is obtained by reading the position of the image area indicating mark marked on the film, and the relative position of the reference position to the image area is obtained. Further, the film positioning means is movable according to the reference position corresponding to the image area, which is read by the reading means, and can hold the reference position of the film at the position where the film positioning means has been moved. As a result, the image recorded on the film can be registered at the predetermined position of the photosensitive material. The marking of the reference position and the reading of the position of the image area indicating mark can be carried out before the film is conveyed to a printing station where the image recorded on the film is printed onto the photosensitive material. After the reference position is marked and the position of the image area indicating mark is read, the film is conveyed to the printing station. However, the film positioning means described in the above, can be moved concurrently with the conveyance of the film to the printing station. Namely, referring to operation procedure, when a first film is being loaded into the printing station, marking of the reference position of a second film and the reading of the position of the image area indicating mark are carried out. When the printed film is discharged from the printing station, the film positioning means is moved for the next film. Thus, it can be avoided to waste time on positioning a film onto a photosensitive material at the printing station, which makes it possible to reduce the printing time.

In addition, when the film positioning means is moved, dimension of a positioning error of apparatus can substantially be eliminated taking account of the dimension of a positioning error of the printing apparatus beforehand. The making of the reference position of the film may be conducted by punching a plurality of punch-holes at predetermined positions where no image is recorded on the film, or one end of the film may be used as the reference position of the film. If the punch-holes are used as the reference positions, pins insertable into the punch-holes may be used as the film positioning means. Further, the image area indicating mark marked on the film may indicate an area of the image recorded on the film. A register mark or the like may be used as this image area indicating mark.

In the positioning device according to the present invention, the film, which has the image area indicating mark indicating the position where an image is recorded, is moved and positioned by moving pins inserted into through-holes as the reference positions by use of a first moving means and a second moving means in a predetermined plane, so that the image area indicating mark lies at a position corresponding to the predetermined position of the photosensitive material. At least two pins are disposed at a predetermined space and the pins are inserted into the through-holes of the film to hold the film and pin the position of the film. A first moving means moves at least two of the pins simultaneously. A second moving means independently moves at least two of the pins in a direction perpendicular to the direction in which they are moved by the first moving means in the same direction or in directions opposite to each other. A means for maintaining an interval between the pins may maintain a predetermined space between the pins when at least two of the pins are moved by the second moving means.

According to the above-described arrangement of the present invention, the film is retained with at least two of the pins inserted into the through-holes provided on the film, while the positioning between the film and the photosensitive material is conducted by means of the above-described first and second moving means so that the image area indicating mark marked on the film lies at the position corresponding to the predetermined position of the photosensitive material. Further, when at least two of the pins are moved by the second moving means, a predetermined space between the pins is maintained by the above-described means for maintaining the interval therebetween. Consequently, since the film can be moved freely on a predetermined plane, which includes the range over which at least two of the pins are moved, it is possible to carry out the positioning of the film with the photosensitive material in a short time.

DETAILED DESCRIPTION OF THE PREFERRED EMBODIMENT

Figure 1:
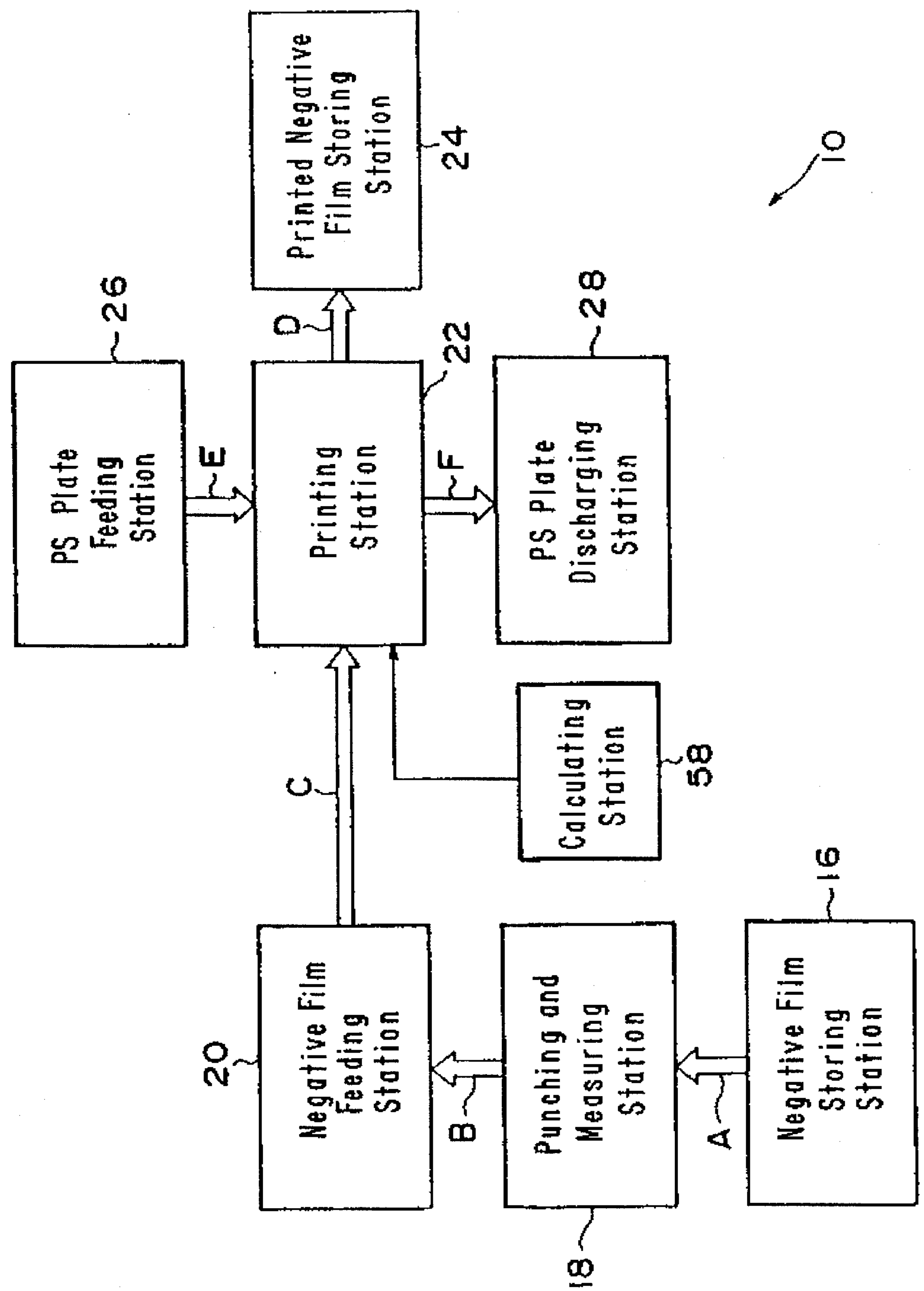
FIG. 1 is a schematic systematic view of a printing apparatus for printing plate according to the present embodiment.

Referring to the accompanying drawings, a printing apparatus for printing plate 10 according to the present invention is described. Incidentally, large arrows A through D as shown in the drawings denote a flow of a negative film 12, and large arrows E and F denote a flow of a PS plate 14. In addition, the negative film 12 is conveyed substantially horizontally to each processing station by means of a conveying mechanism (not shown).

FIG. 1 illustrates a schematic view of the print material printing apparatus 10 according to the present embodiment. This apparatus 10 has a storing station 16 for storing negative films 12 on which images are recorded, a punching and measuring station 18 for marking a reference position of a negative film 12, a negative film feeding station 20, a printing station 22, a storing station 24 for storing printed negative films 12, a PS plate 14 fed to the printing station 22 and a PS print discharging station 28 for discharging the printed PS plate 14 to the outside of the print material printing apparatus 10.

The PS print 14 can be fed to the PS plate feeding station 26 by using an autofeeder as described in Japanese Patent Application Laid-Open Nos. 63-106245 and 63-171728 and the like.

Further, a processing unit, such as those described in Japanese Utility Model Application Laid-Open Nos. 60-35072 and 62-3429 and the like, may be connected to the plate discharging station 28 to serve as a subsequent process. A punching unit, folding unit and the like may also be connected to the processing unit to serve as a subsequent process.

The PS plate 14, which is fed from the PS plate feeding station 26 to the printing station 22, is positioned and placed onto the surface plate 60 provided at the printing station 22. The negative film 12 fed from the negative film feeding station 20 is placed onto the PS plate 14 and is positioned at a predetermined position on the PS plate 14 by a unit 62 for positioning the negative film.

In this state, light beams are irradiated from above by means of a light source 134, such as a lamp, so that an image recorded on the negative film 12 is printed onto the PS plate 14.

After the image of the negative film 12 is printed on the PS plate 14, the negative film 12 is moved from above the PS plate 14 to the storing station 24. The PS plate 14 is discharged from the PS plate discharging portion 28 to the outside.

Next, the negative film 12 on which the image is recorded is explained.

Figure 2:
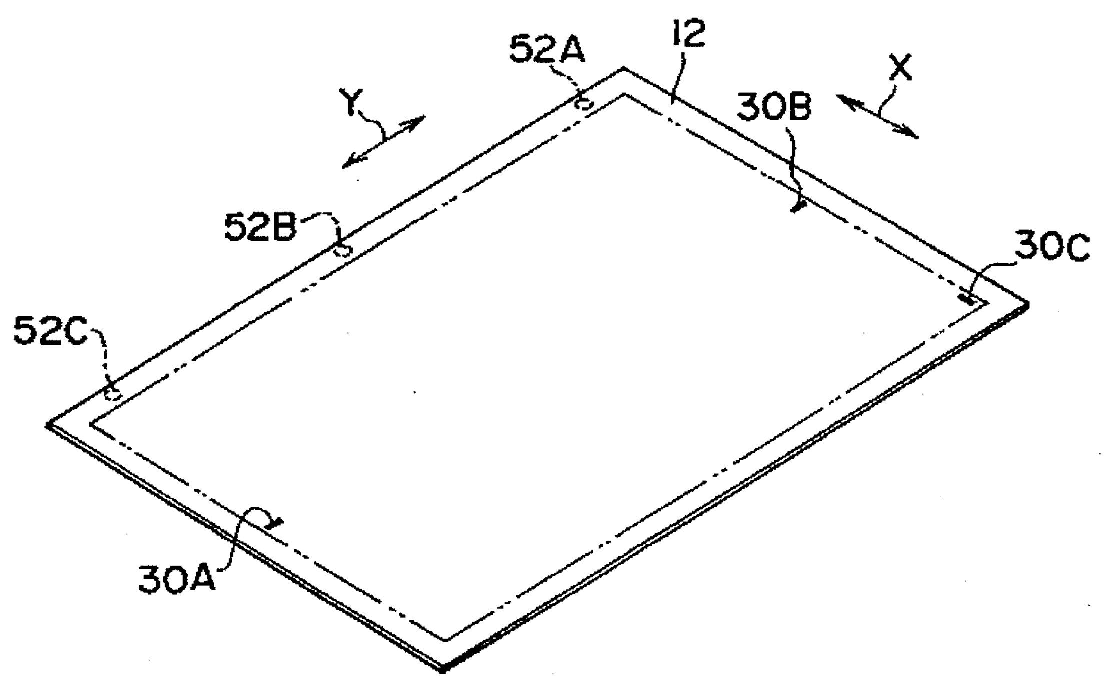
FIG. 2 is a perspective view illustrating a film according to the present embodiment.

As illustrated in FIG. 2, the image is recorded at a substantially central portion of a thin and transparent planer support of the negative film 12 (indicated by the two-dot chain line of FIG. 2). As end portions of this recorded image, a plurality of register marks 30A, 30B and 30C are marked indicating the position of the image.

The register marks 30A and 30B are marked at both end portions as viewed in the vertical direction of the negative film 12 (in the direction of arrow Y in FIG. 2) so as to indicate the center of the image recorded on the negative film 12. In addition, the register mark 30C is marked at an upper end portion of the negative film 12 and at one end as viewed in the transverse direction of the negative film 12 (in the direction of arrow X in FIG. 2) so as to run in the transverse direction of the negative film 12. An upper end of the image recorded on the negative film 12 is indicated by this register mark 30C. These register marks 30h, 30B and 30C allow the area of the image recorded on the negative film to be recognized.

When the register marks 30A, 30B and 30C are printed on the negative type PS plate 14, they are masked and do not appear on the printed matter. The register marks 30A, 30B and 30C often remain on the printed matter for the positive type PS plate.

Although the main portion of the printing apparatus for printing plate 10 is hereinafter described, a detailed description is partially omitted. In addition, in each of the following figures, the directions of X and Y correspond respectively to the transverse and vertical directions of the negative film 12 disposed at each processing portion.

Figure 3:
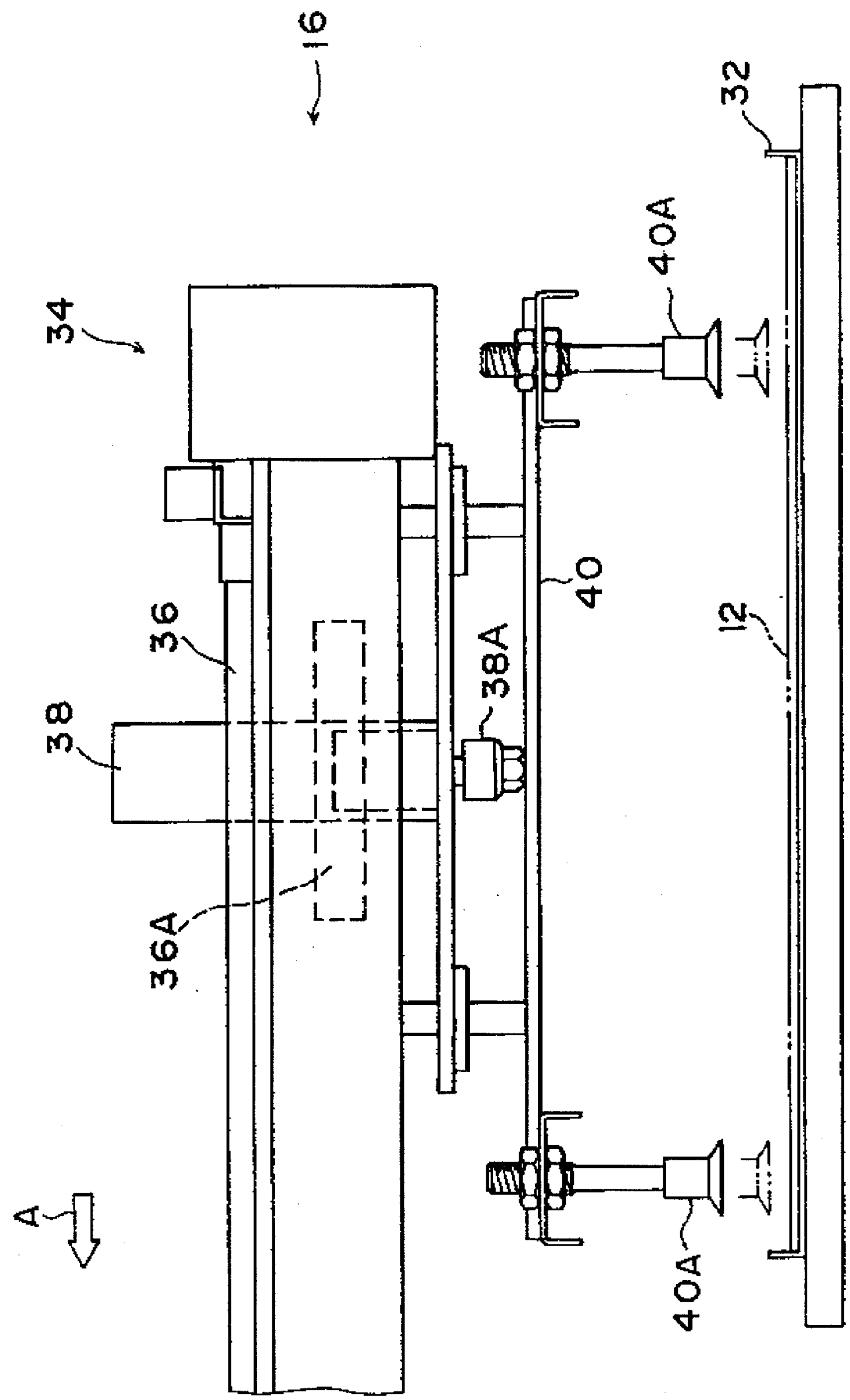
FIG. 3 is a side view of the present embodiment.

As shown in FIG. 3, the negative film 12 for printing the image onto the PS plate 14 can be stored within the storing station 16 of the printing unit for printing plate 10. At this storing station 16, a tray 32 is provided to accommodate the negative film 12 stacked horizontally. This tray 32 is substantially the same size as that of the negative film 12. The negative films 12 are accommodated in the tray 32 with their lateral end portions constantly aligned.

Provided above this tray 32 is a conveying unit 34 for conveying the negative film 12 as shown in, for example, FIG. 3. In this conveying unit 34, a hanger 40 is provided at an end of a driving shaft 38A located at an air cylinder 38, which is retained against a driving portion 36A of a rodless cylinder 36. A plurality of suction cups 40A is disposed at an end of this hanger 40. A negative pressure supplying means (not shown) is connected to each of these suction cups 40A.

When negative pressure is supplied to the suction cups 40A by the negative pressure supplying means, the negative film 12 accommodated within the tray 32 is sucked. Further, when the air cylinder 38 and the rodless cylinder 36 are driven, the negative film 12 is conveyed in a substantially horizontal state (in the direction of large arrow A of FIG. 3.

Figure 4:
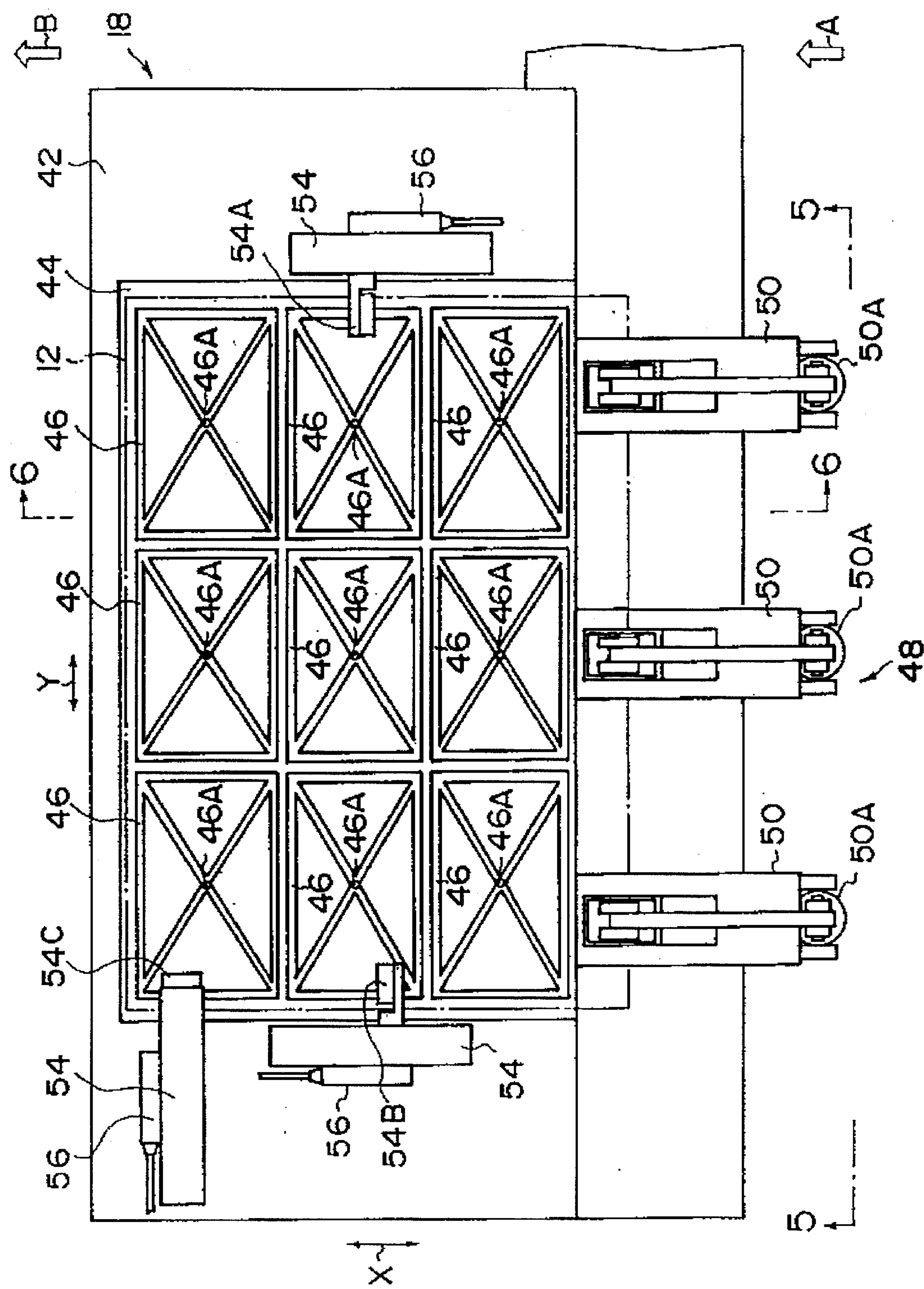
FIG. 4 is a plan view of the main part of a reference position marking means according to the present embodiment.
Figure 5:
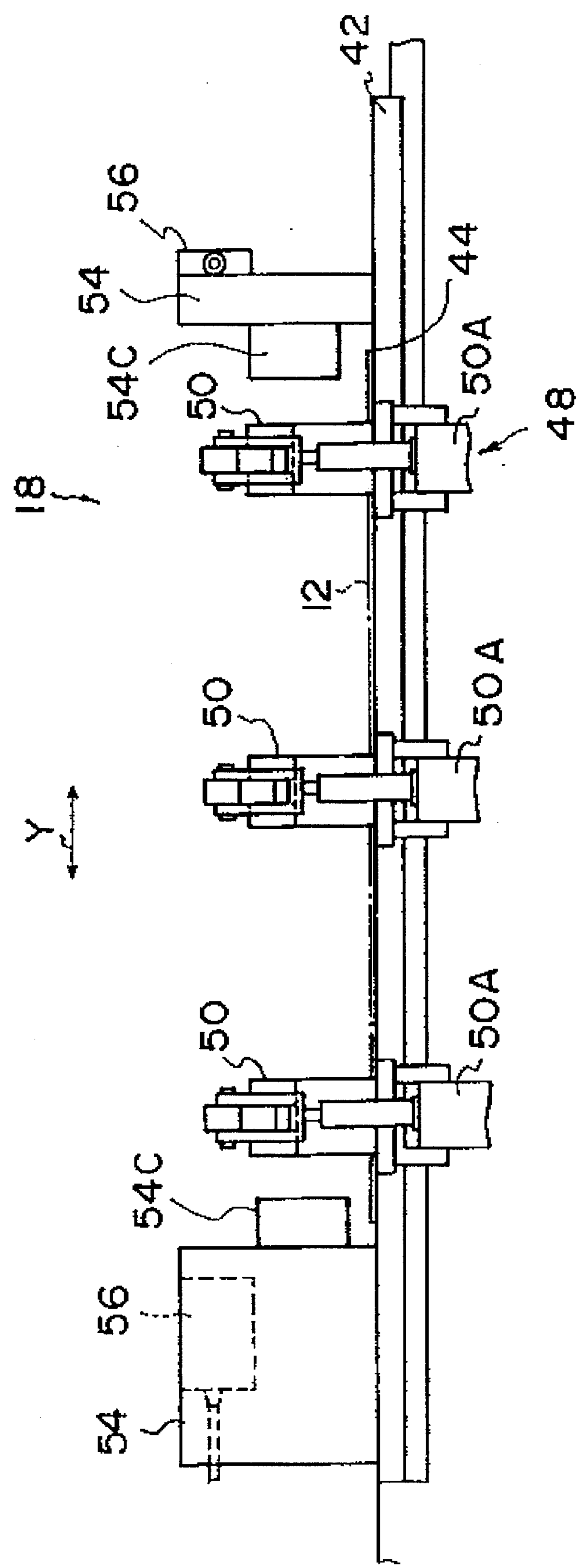
FIG. 5 is a side view taken along line 5—5 of FIG. 4.
Figure 6:
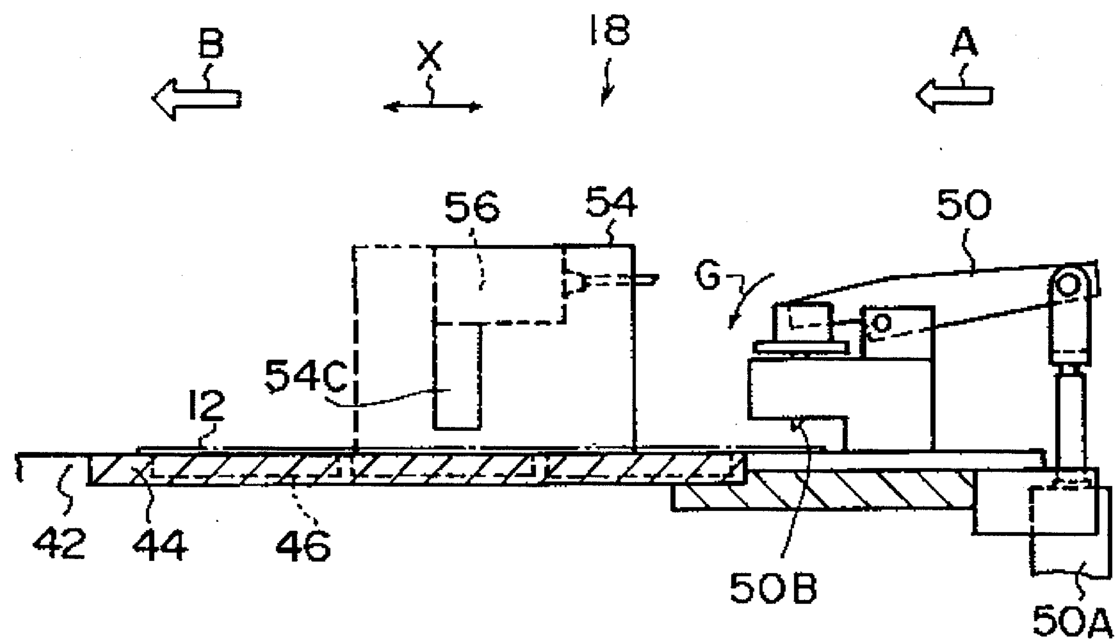
FIG. 6 is a cross-sectional view of the main part taken along line 6—6 of FIG. 4.

As shown in FIG. 1, after the storing station 16, a punching and measuring station 18 is provided. As shown in FIGS. 4 through 6, at this punch-hole measuring station 18, a surface plate 44 for horizontally placing the negative film 12 is provided at a substantially central portion of a base plate 42. On the upper surface of this surface plate 44, a plurality of grooves 46 is formed over substantially the entire surface. These grooves 46 are formed not only rectangularly but also diagonally. A hole 46A is provided at the points of intersection of the diagonal lines of these grooves 46, to which a negative pressure supplying means (not shown) is connected.

The negative film 12 is conveyed from the station 16, and the image portion of the negative film 12 is placed at the portion where the groove 46 of the surface plate 44 is formed. In addition, one end of the negative film 12 as viewed in the transverse direction (the direction of arrow X of FIG. 4) protrudes from the surface plate 44. After the negative film 12 is placed on the surface plate 44, when negative pressure is supplied by the negative pressure supplying means, the negative film 12 is sucked to and pinned to the surface plate 44.

At a side of the surface plate 44, a punch portion 48, which serves as a means for marking the reference positions for the negative film 12, is disposed. The one end portion of the negative film 12 protruding from the surface plate 44 faces this punch portion 48. Three punchers 50 are disposed at equal intervals on this punch portion 48 along the surface plate 44 so that punch-holes 52A, 52B and 52C, which serve as the reference positions for the negative film 12, are punched. At these punchers 50, an air cylinder 50A is provided. By the driving of the air cylinder 50A, a punch tooth 50B is swung and protruded in the direction of arrow G to punch the negative film 12 (shown in FIG. 2) with the punch-holes 52A, 52B and 52C.

Although, in this embodiment three punchers 50 are disposed at equal intervals, there may be two or more, and the punchers 50 may be disposed at unequal intervals.

In addition, above an end portion of the surface plate 44, sensors 54A, 54B and 54C, which are each a reading means, are each mounted to a respective base 54 and read the positions of the register marks 30A, 30B and 30C marked on the negative film 12. The sensor 54A is disposed at a substantially central portion of one end portion, as viewed in the direction of arrow Y, of the surface plate 44. The sensor 54B is disposed at a substantially central portion of another end portion as viewed in the direction of arrow Y. In addition, the sensor 54C is disposed in the neighborhood of an end portion opposite to the punch portion 48 at another end portion, as viewed in the direction of arrow Y, of the surface plate 44.

The bases 54 of these sensors 54A, 54B and 54C are mounted to other ends of the fixed end portions of cylinders 56. When the cylinders 56 are driven, each base 54 is moved along the surface plate 44, which is on the base 42. Movement of these bases 54 causes the sensors 54A and 54B to move in the transverse direction of the negative film 12. The positions of the register marks 30A, 30B and 30C on the surface plate 44 are read by these sensors 54A, 54B and 54C.

Incidentally, although in this embodiment the center of the image is indicated by the register marks 30A and 30B and the upper end of the recorded image can be known by the register mark 30C, the present invention is not necessarily registered to the same. It is sufficient if these register marks 30A, 30B and 30C can precisely indicate the image area recorded on the negative film 12, and the sensors may be disposed correspondingly.

The positions of the register marks 30A, 30B and 30C, which are read out by the sensors 54A, 54B and 54C of the punch-hole measuring station 18, are fed to a calculating station 58, where the relative positions of the punch-holes 30A, 30B and 30C read out by the sensors 54A, 54B and 54C is obtained. Namely, since the three punchers 50 of the punch-hole measuring station 18 are fixed adjacent to the surface plate 44, the relative positions of the punch-holes 52A, 52B and 52C to the image area can be known by knowing the image area on the surface plate 44.

In addition, at the calculating station 58, the dimension of a positioning error of the printing apparatus for printing plate 10 can be entered in advance. Thus, the positions of the punch-holes 52A, 52B and 52C, including the dimension of a positioning error of the printing apparatus for printing plate 10 relative to the image area recorded on the negative film 12, can be obtained. Data calculated by this calculating station 58 is fed to the printing station 22, which will be described later.

The negative film 12, which is punched with the punch-holes 52A, 52B and 52C at the punching and measuring station 18, is fed into the negative film feeding station 20 (in the direction of arrow B in FIG. 1). In addition, the negative film 12 is fed out from the negative film feeding station 20 to the printing station 22 (in the direction of arrow C in FIG. 1).

The PS plate feeding station 26 receives the PS plate 14 fed from the outside of the printing station 22 (in the direction of arrow E in FIG. 1).

Figure 7:
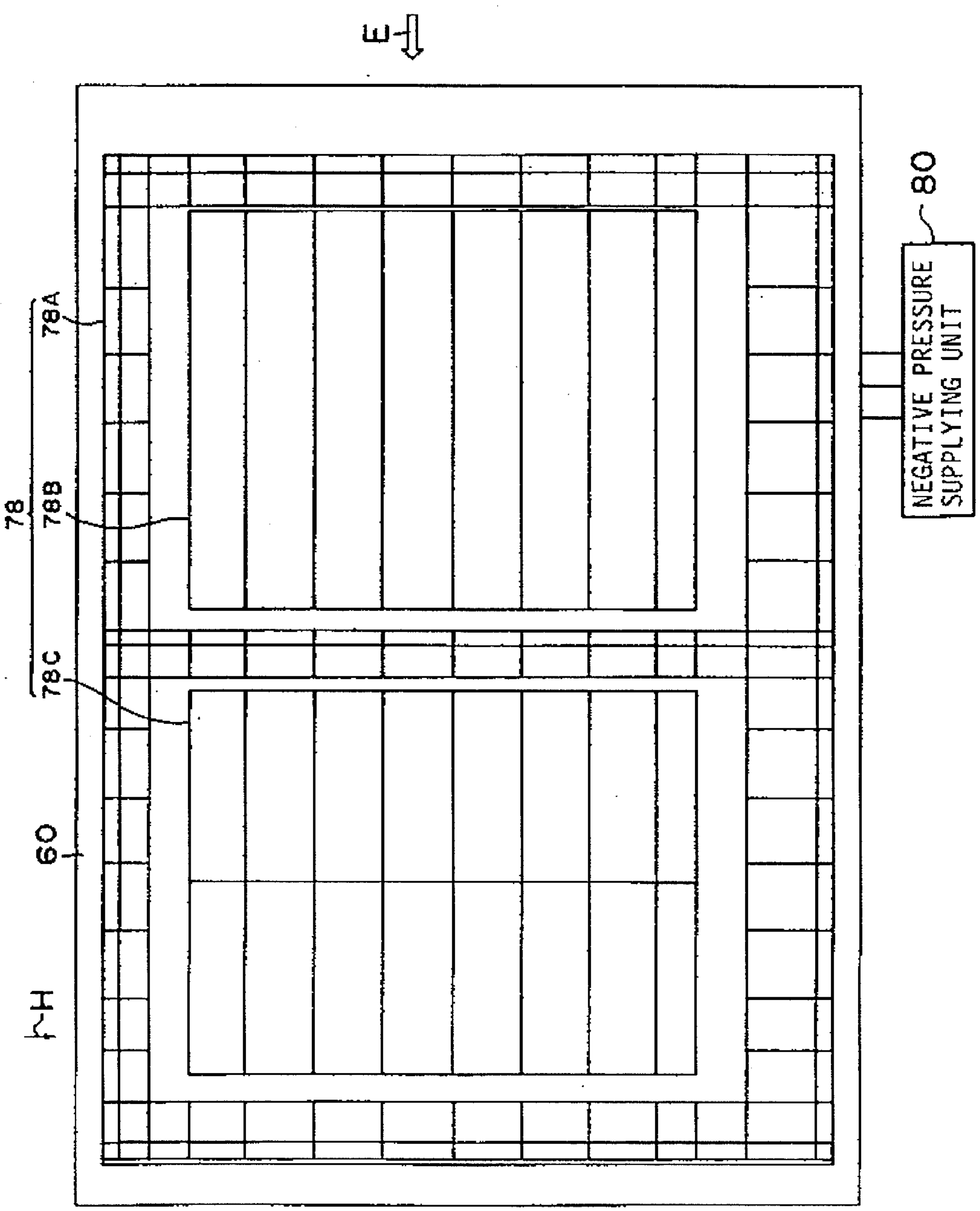
FIG. 7 is a plan view of the main part of a printing station according to the present embodiment.

At the printing station 22, a surface plate 60 is provided to horizontally place the PS plate 14 onto a base 88. Suction grooves 78 are formed on a top surface of the surface plate 60 of the printing station 22, as shown in FIG. 7. These suction grooves 78 are formed with a first suction groove 78A, which is formed by being connected by an outer peripheral portion and an intermediate portion of the top surface of the surface plate 60, and second and third suction grooves 78B and 78C, which are surrounded by this first suction grooves 78B and 78C, which are surrounded by this first suction groove 78A.

These first, second and third suction grooves 78A, 78B and 78C are each connected to the negative pressure supplying unit 80 so that each may be independently supplied with negative pressure to suck the PS plate 14 placed on the surface plate 60. By this suction, the PS plate 14 is pinned onto the surface plate 60.

Figure 8:
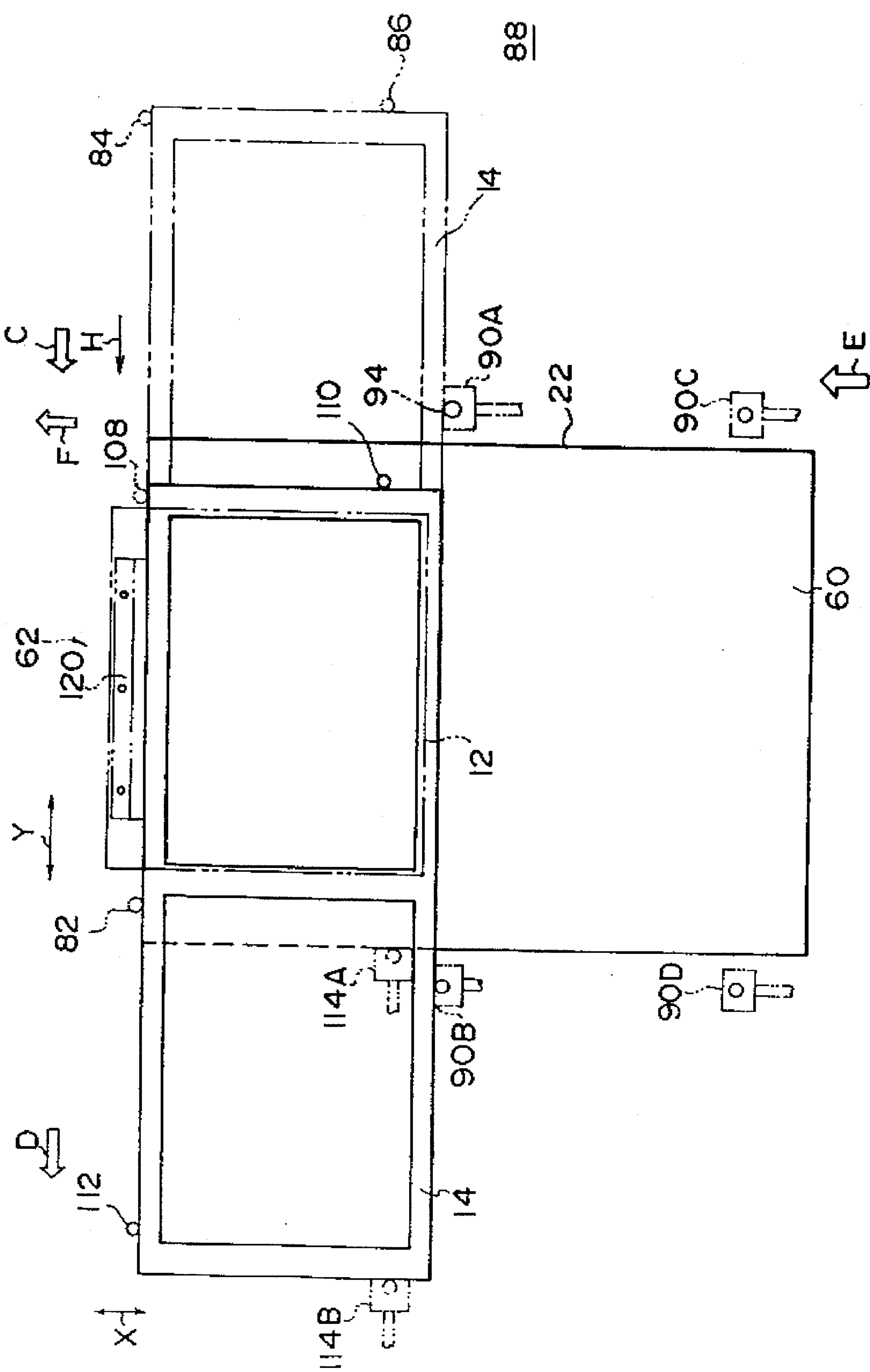
FIG. 8 is a plan view of the main part illustrating how a PS print is positioned at the printing station.

In addition, since the suction grooves are a triple system, when, as shown in FIG. 8, for example, the size of the PS plate 14 is small (that is, a print size corresponding to two pages of newspaper), it is sufficient if negative pressure is supplied only to the suction grooves 78. Even if the negative film 12 is placed on the surface plate 60, the negative film 12 is not sucked onto the surface plate 60.

Figure 9:
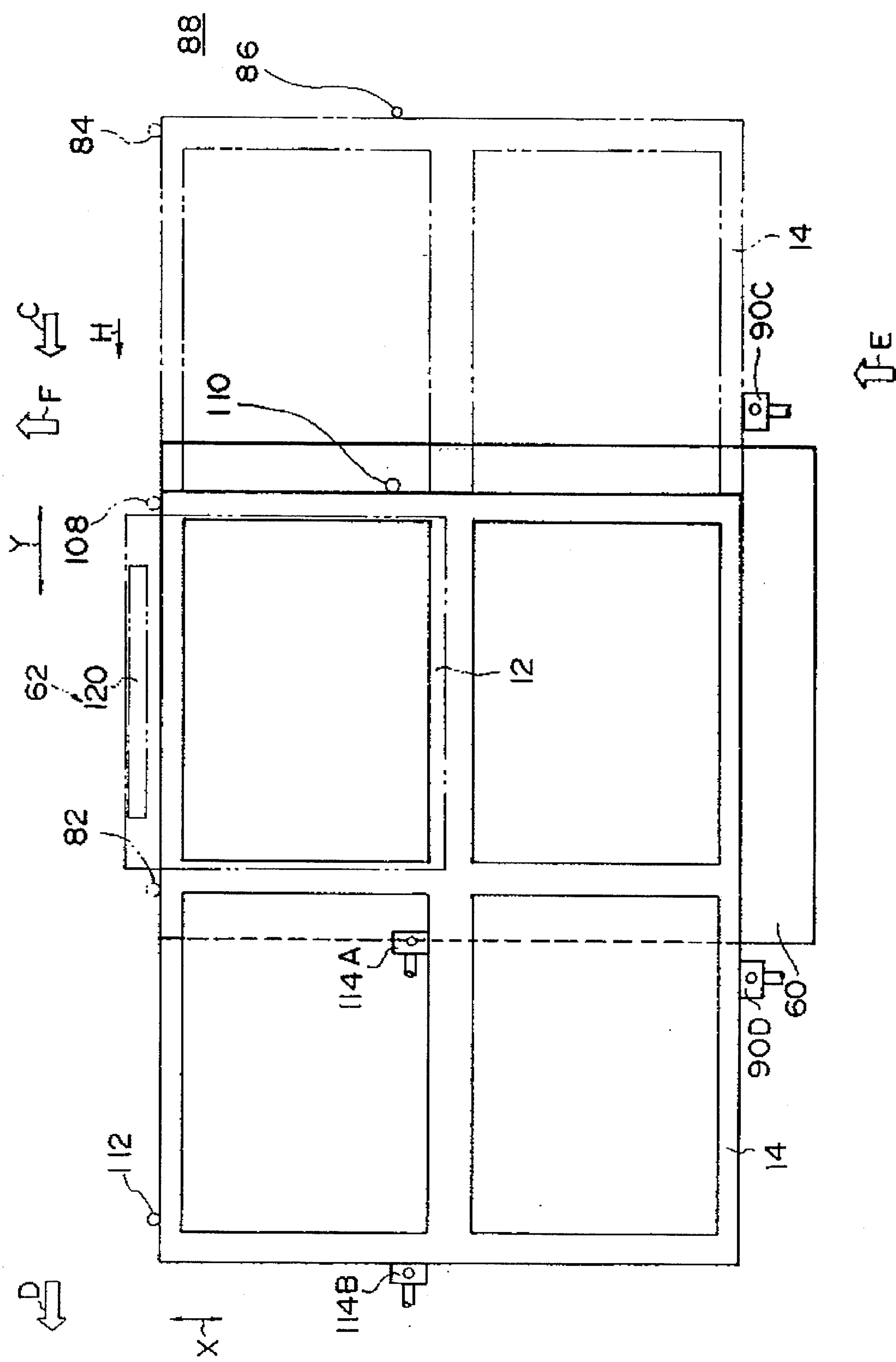
FIG. 9 is a plan view of the main part, similar to that of FIG. 8.

In addition, as shown in FIG. 9, when the size of the PS plate 14 is large (that is, a print size corresponding to four pages of newspaper), negative pressure is supplied to all the suction grooves 78A, 78B and 78C.

Next, the positioning of the PS plate 14 at the printing station 22 is described. Incidentally, the PS plate 14, which is placed onto the surface plate 60 from the PS plate feeding station 26, is positioned as described below, after being moved to a predetermined position on the surface plate 60 by a conveying mechanism (not shown) such as suction cups or the like.

The positioning unit for positioning the PS plate 14 comprises pressure means for moving the PS plate 14 under pressure, and a mechanism for positioning the PS plate 14 at the predetermined position by abutting an end surface of the moved PS plate 14, Incidentally, FIG. 8 illustrates a case of the PS plate 14 for two pages of newspaper, FIG. 9 illustrates a case of the PS print 14 for four pages of newspaper.

As illustrated in FIGS. 8 and 9, on a lateral surface of a front side, as viewed in the direction in which the PS plate 14 of the surface plate 60 is inserted (the direction of large arrow E of FIGS. 8 and 9), of the PS plate 14, a reference pin 82 for the surface plate is disposed so as rise above and sink below the surface plate 60, to determined the position of the PS plate 14 in the transverse direction. In addition, at sides of the surface plate 60, reference pins 84 and 86 outside of the surface plate 60 are erected above the base 88. The end portions of the reference pin 82 for the surface plate and the reference pin 84 outside of the surface plate are positioned at the front side of the PS plate 14, that is, the ends inserted from the direction of large arrow E abut on the front side of the PS plate 14. In addition, the PS plate 14 is positioned in a direction at a right angle to the direction in which it is vertically inserted by abutting against the reference pin 86 outside of the surface plate 60. The PS plate 14 positioned by the reference pin 82 for the surface plate and the reference pins 84, 86 outside the surface plate is exposed by the negative film 12 adhering to the print surface at the left side of the paper, as shown in FIGS. 8 and 9.

Next, the PS plate 14 is moved in the direction of arrow H by means of a conveying mechanism (not shown). A reference pin 108 is disposed on a side surface of the surface plate 60 so as to be able to rise above and sink below the upper surface of the surface plate 60. In addition, a reference pin 112 outside of the surface plate is provided at the side of the negative film storing station 24 of the surface plate 60. This reference pin 112 outside of the surface plate may rise and sink. When the PS plate 14 is discharged, the reference pin 112 outside of the surface plate is brought down lower than the height of the surface plate 60.

After being moved in the direction of arrow H, the PS plate 14 is positioned by being abutted against the reference pins 108, 110 for the surface plate and the reference pin 112 outside the surface plate. Namely, the reference pins 108, 110 and 112 are intended for positioning the PS plate 14 so that the image of the negative film 12 is printed onto the print surface at the right side of the PS plate 14.

Incidentally, the reference pins 82, 108 and 110 for the surface plate and 84, 86 and 112 outside the surface plate are each disposed so as to abut against the same position whether the image is printed on the right side or the left side of the PS plate 14.

In addition, the portion of the PS plate 14 protruding from the surface plate 60 is horizontally supported by means of a guide plate (not shown) or the like having the same height as that of the surface plate 60.

Next, the pressure means is described. As shown in FIGS. 8 and 9, in order to position the PS plate 14 so that the left side surface is printed, pushers 90A (for a two-page print) and 90C (for a four page print) for pressing the PS plate 14 toward the reference pin 82 for the platen, and the reference pins 84 and 108 outside the surface plate are disposed about the surface plate 60. In order to position the PS plate 14 that the right side surface is printed, pushers 90B and 90D for pressing the PS plate 14 toward the reference pin 108 for the surface plate and the reference pin 112 outside of the surface plate are disposed. In other words, the pushers 90A and 90B are intended for pressing the PS plate 14 of the size of two pages of newspaper. The pushers 90C and 90D are intended for pressing the PS plate of the size of four pages of newspaper.

In addition, pusher 114A and 114B are disposed about the surface plate 60. The pusher 114A abuts on either end in the longitudinal direction (in the direction of arrow H or the opposite direction there to in FIG. 8 and FIG. 9) of the PS plate 14. The pusher 114A presses the PS plate 14 toward the reference pin 86 outside of the surface plate 60. The PS plate 14 is positioned in the longitudinal direction of the left side plate of the PS plate 14 for printing. In addition, the pusher 114B abuts on either end in the longitudinal direction of the PS plate 14. The pusher 114B presses the PS plate 14 toward the reference pin 110 for the surface plate 60. The PS plate 14 is positioned in the longitudinal direction of the right side plate of the PS plate 14 for printing.

These pushers 90A, 90B, 90C, 114A and 114B are each driven by an air cylinder (not shown) to position the PS plate 14.

Next, the positioning of the negative film 12 on the PS plate 14 is described.

A positioning unit 62 is disposed in a vicinity of the surface plate 60 to position the negative film 12 onto the PS plate 14.

As shown in FIGS. 8 and 9, the positioning unit 62 is disposed in the vicinity of the surface plate 60 between the reference pin 82 for the surface plate and the reference pin 108 for the surface plate.

Figure 10:
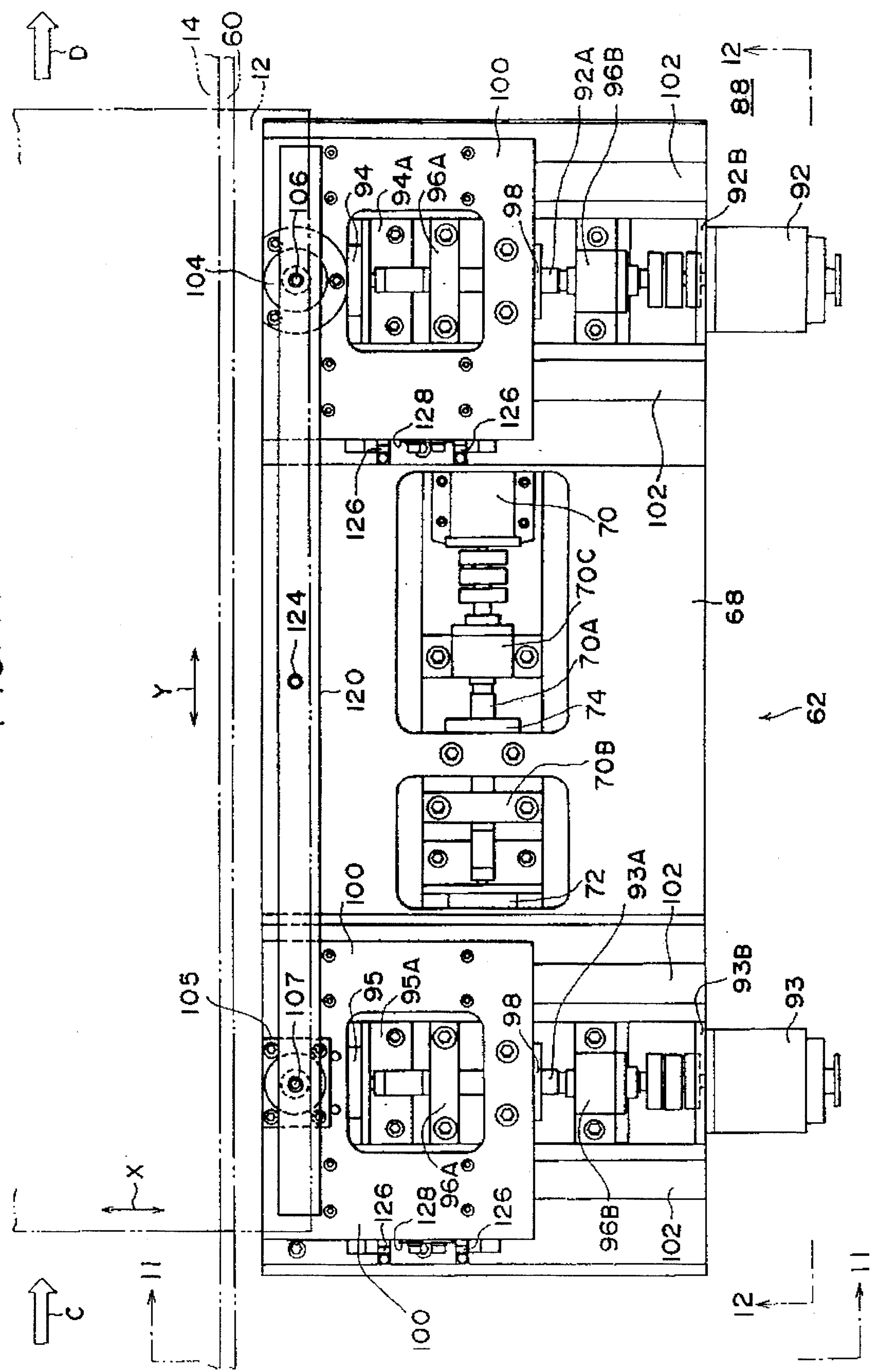
FIG. 10 is a plan view illustrating a positioning device according to the present embodiment.
Figure 11:
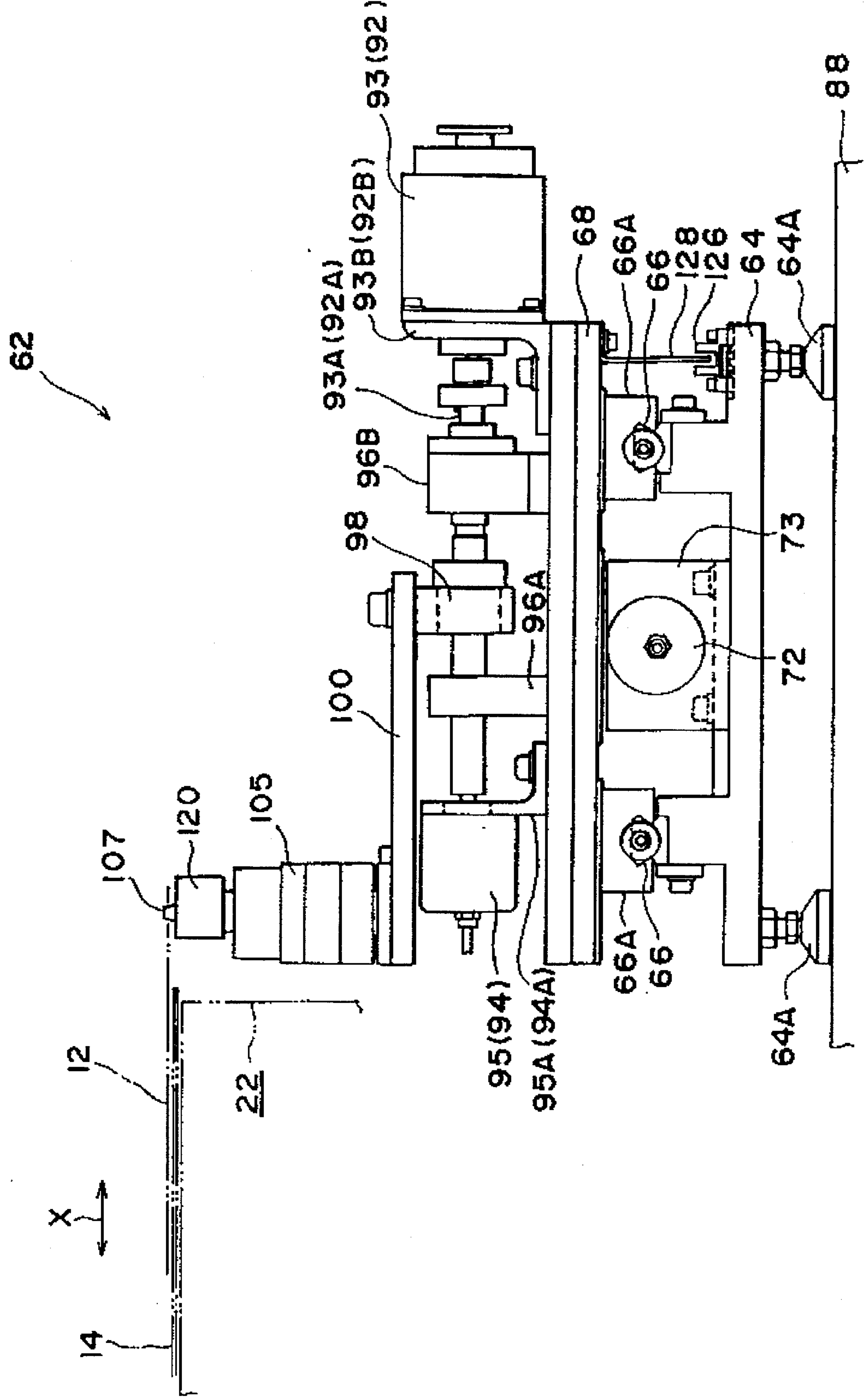
FIG. 11 is a side view taken along line 11—11 of FIG. 10.
Figure 12:
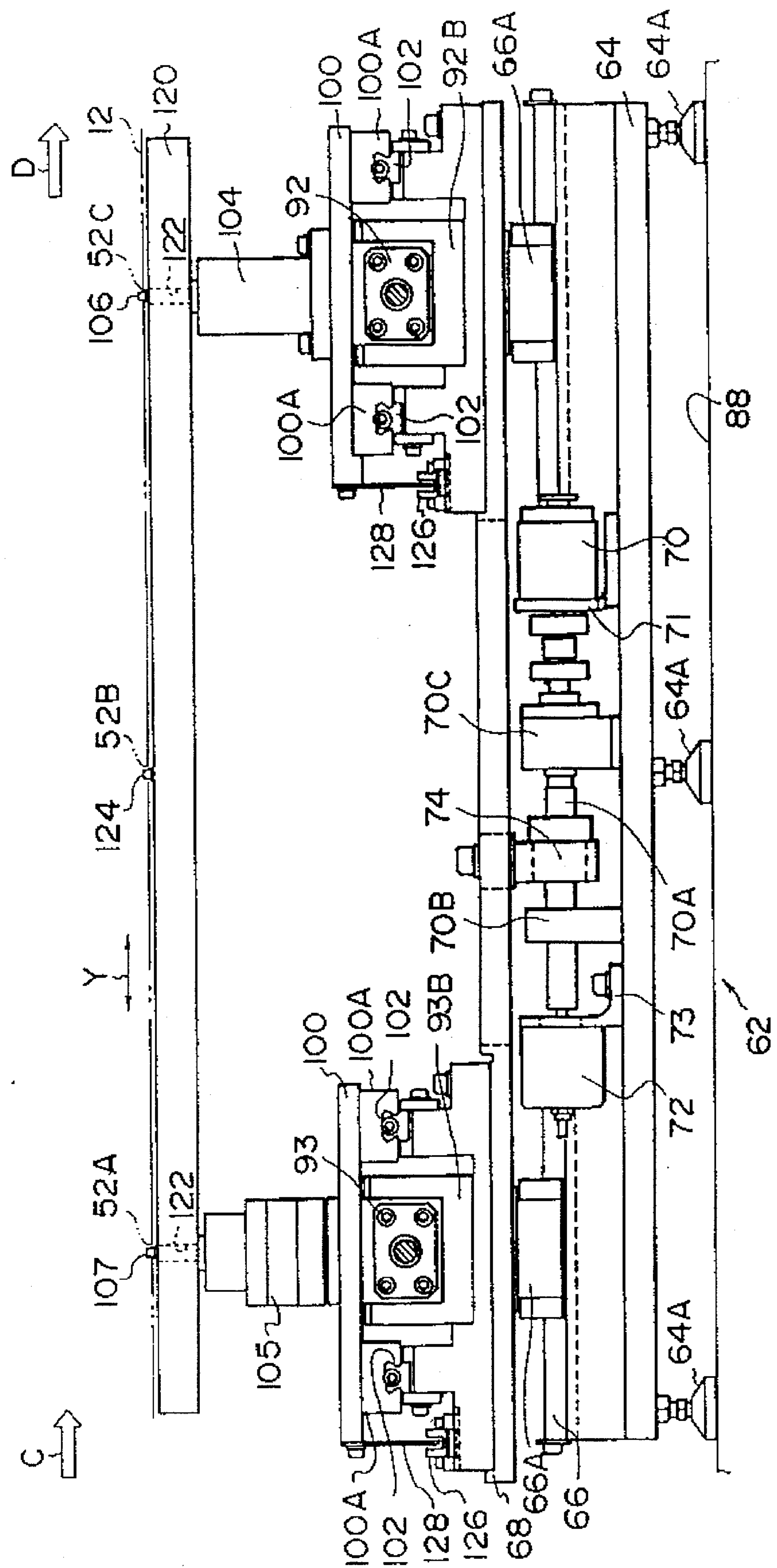
FIG. 12 is a side view taken along line 12—12 of FIG. 10.

FIGS. 10 through 12 each illustrate the positioning unit 62. As illustrated in FIGS. 11 and 12, at the positioning unit 62, a base plate 64 is fixed to a base 88 of the printing station 22 by a plurality of leg portions 64A. Heights of these leg portions 64A are each adjustable. The positioning unit 62 can thereby be maintained in a horizontal condition.

A pair of guide rails 66 is disposed in parallel at this baseplate 64. A moving plate 68 is slidably disposed along these guide rails 66 via a linear bearing 66A. This moving plate 68 is suspended over both end portions of the pair of guide rails 66 as viewed in the axial direction thereof.

In addition, a stepping motor 70, which serves as the first moving means, and an encoder 72 are respectively mounted to the base plate 64 by means of brackets 71 and 73. A driving shaft 70*a* of the stepping motor 70 runs parallel to the axial line of the pair of guide rails 66. The encoder 72 is connected to an end of the driving shaft 70A. An intermediate portion of the driving shaft 70A of the stepping motor 70 is supported by means of a pair of bearings 70B and 70C fixed to the baseplate 64. Further, a mobile bracket 74 is provided between the pair of bearings 70B and 70C. This mobile bracket 74 is further fixed to the moving plate 68. This mobile bracket 74 moves along the axial line of the driving shaft 70A by the rotation of the driving shaft 70A.

When the stepping motor 70 is driven and the driving shaft 70A is rotated in the predetermined direction, the mobile bracket 74 is moved along the driving shaft 70A in the direction of moving away from the stepping motor 70. When the driving shaft 70A is rotated in the direction opposite to the predetermined direction towards the stepping motor 70. As this mobile bracket 74 moves, the moving plate 68 is moved.

At both end portions of the direction of movement of the moving plate 68, stepping motors 92 and 93, which are each second moving means, are provided. Encoders 94 and 95 are respectively provided at an end of each of the driving shafts 92A and 93A of the stepping motors 92 and 93. These stepping motors 92 and 93 and the encoders 94 and 95 are respectively fixed to the moving plate 68 by means of brackets 92B, 93B, 94A and 95A.

An intermediate portion of each of the driving shafts 92A and 93A is supported by means of a pair of bearings 96A and 96B fixed to the moving plate. A mobile bracket 98 is disposed between the pair of bearings 96A and 96B. A pin base 100 is fixed to each of the mobile brackets 98. The pin base 100 is slidably supported by a pair of guide rails 102, which are disposed at both sides along the driving shafts 92A and 93B, via a linear bearing 100A. These driving shafts 92A and 93A and the guide rails 102 are disposed so as to intersect the guide rails 66 of the baseplate 64 at a right angle.

In addition, at each pin base 100, pin brackets 104 and 105 are provided so as to protrude upwardly. Pins 106 and 107 are disposed at top ends of the pin brackets 104 and 105. A pin bar 120 is suspended between these pins 106 and 107. The pin bar 120 is bar-shaped. Through-holes 122 are bored at both ends of the pin bar 120 as viewed in the longitudinal direction thereof so that the axis of each of the through-holes 122 are parallel. The distance between the axes of these through-holes 122 is set equal to the distance between the axes of the punch-holes 52A and 52C provided through the negative film 12. In addition, a pin 124 is disposed at an intermediate portion of the pin bar 120.

Pins 105 and 107 of the pin brackets 104 and 105 are inserted into and supported by respective through-holes 122 of the pin bar 120. In addition, top ends of these pins 106 and 107 protrude from the through-holes 122 of the pin bar 120 so as to dispose the pins 106, 124 and 107 in a straight line in the longitudinal direction of the pin bar 120 and at equal intervals.

These pins 107, 124 and 106 can be inserted into the punch holes 52A, 52B and 52C punched through the negative film 12. In addition, the pin bar 120 has substantially the same height as that of the top surface of the PS plate 14 placed on the surface plate 60. In addition, the pin bracket 105 can be slid along the surface of the pin base 100. Consequently, the pin bar 120 can be moved freely by the driving of the stepping motors 70 and 92, and is moved in the directions of X and Y of the negative film 12 corresponding to the punch-holes 52A, 52B and 52C.

This movement is carried out based on the relative position of the punch-holes 52A, 52B and 52C and the image, which are measured by the punch-hole measuring station 18 and calculated by the calculating station 58. Therefore, movement of the pin bar 120, which supports the pins 107, 124 and 106 inserted into the punch holes 52A, 52B and 52C, causes the portion of the negative film where the image is recorded to be disposed at the predetermined position on the PS plate 14.

In addition, in order to reset the positioning unit 62, encoders 72, 94 and 95, provided at an end of each of the driving shafts 70A, 92A and 93A of each stepping motor 70, 92 and 93, rotate the driving shafts 70A, 92A and 93A by the application of a predetermined voltage to return the mobile brackets 74 and 98 to the predetermined positions.

Further, as shown in FIGS. 10 and 12, a pair of sensors 126, each formed with a slit, and detecting plates 128, insertable into the slits of the sensor 126, are disposed between the pin base 100 and the moving plate 68. The range of movement of the pin base 100, which is moved by the driving of each of the stepping motors 92 and 93, is restricted by the detecting plates 128 and the pair of sensors 126. Further, as shown in FIG. 11, the detecting plates 128 and the pair of sensors 126 (only one is shown in FIG. 11) are also disposed between the baseplate 64 and the moving plate 68 so that the range of movement of the moving plate 68, which is caused by the driving of the stepping motor 70, is limited.

Incidentally, in order to remove the stagnant air between the PS plate 14 placed on the surface plate 60 and the negative film 12 positioned on and pinned to the upper surface of the PS plate 14, a squeezing mechanism (not shown) is provided. The stagnant air between the PS plate 14 and the negative film 12 is removed by the squeezing mechanism. The PS plate 14 and the negative film 12 adhere closely.

Next, a light source 134 is described. The light source 134 serves to print the image of the negative film 12, which is placed and adheres to the PS plate 14, onto the PS plate 14.

Figure 13:
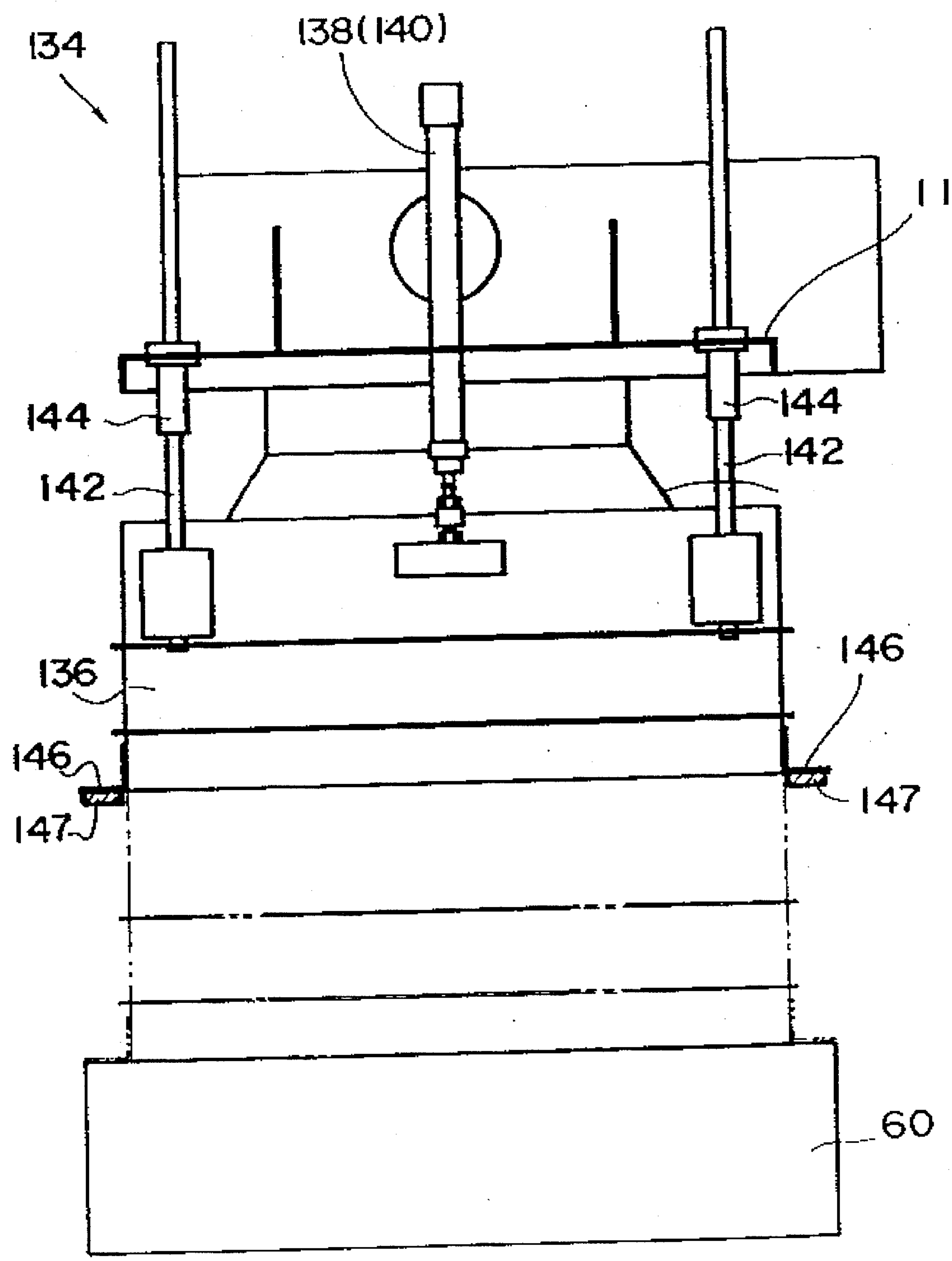
FIG. 13 is a lateral view illustrating a positional relationship between a light source of the printing station and a surface plate.

As shown in FIG. 13, the light source 134 is disposed above the surface plate 60. This light source 134 is covered with a light source hood 136. This light source hood 136 is mounted to ends of driving shaft of two air cylinders 138 and 140, which are supported by a frame 11 of the printing unit for printing plate 10. The light source hood 136 hangs down by means of the air cylinders 138 and 140.

In addition, one end of the light source hood 136 is coupled to guide bars 142 supported by the frame 11. Intermediate portions of these guide bars 142 are supported by slide bearings 144, which are supported by the frame 11, so as to be able to move vertically. Therefore, the light source hood 136 may be vertically moved (in directions of approaching and moving away from the surface plate 60, as shown in FIG. 13) by the driving of the air cylinders 138 and 140.

Pressing members 146, having L-shaped cross sections, are mounted at a lower end portion of the light source hood 136. Hard sponges 147 are affixed to a lower portion of this pressing member 146. When the hood 136 is lowered, these sponges 147 apply pressure to the overlapping portion between the PS plate 14 on the surface plate 60 and the negative film 12 placed on the PS plate 14.

A conveying roller (not shown) is disposed at the PS plate discharging station 28. The image recorded on the negative film 12 is discharged to the outside of the print material printing apparatus 10.

The negative film 12, which is printed on the PS plate 14 at the printing station 22, is fed into the storing station 24 to be accommodated as the printed negative film 12.

In the specification of the present invention, the term "dimensional individualities" refers to various deviations in each completely assembled print material printing apparatus 10, in particular, the deviations of the sensors 54A, 54B, and 54C from their reference positions, and the deviations of the positioning pins 84, 86, 108, 110, and 112 of the printing section 22, and the like. For each assembled print material printing apparatus 10, the deviation values can be obtained from the misalignment of the position of the image which has been actually printed on the PS plate. The deviation values obtained for each apparatus are input in advance as correction values, so that the dimensional individualities of each apparatus can be substantially eliminated by correcting the amount of movement of the pin bar 120 on the basis of the correction values at the time of printing. In conventional color printing techniques, printings for the respective colors must be conducted by the same apparatus. With the above-described method of the present invention, however, printings for the respective colors can be effected by using different apparatus.

Next, the operation of the present embodiment is described.

The negative film 12 on which the image is recorded is accommodated into the tray 32 at the storing station 16 of the print plate printing unit 10 to actuate the print material printing unit 10.

This negative film 12 is placed and pinned onto the surface plate 44 of the punching and measuring station 18. After this fixing, punch-holes 52A, 52B and 52C are each punched at the end portion of the negative film 12 by the puncher 50 of the punch portion 48. At substantially the same time, the sensors 54A, 54B and 54C are driven, and the positions of the register marks 30A, 30B and 30C marked on the negative film 12 are read out.

The image area of the negative film 12 is confirmed by the positions of the register marks 30A, 30B and 30C on the surface plate 44, which is read by these sensors 54A, 54B and 54C. The positions of the punch-holes 52A, 52B and 52C, which are punched on the negative film 12, and the relative position of the punch-holes 52A, 52B and 52C and the image area are obtained.

In other words, since the relative positions of the punch-holes 52A, 52B and 52C and the surface plate 44 are set constant,relative to the platen 44 is set constant, and the relative position of the punch-holes 52A, 52B and 52C and the image area can be obtained by reading the image area of the negative film 12 on the platen 44.

Next, the negative film 12 is fed from the punch-hole measuring station 18 to the film feeding station 20 to be conveyed to the printing station 22.

At the printing station 22, the PS plate 14 is positioned at the predetermined position on the surface plate 60 while the stepping motors 70, 92 and 93 are driven to move the pin bar 120, The pin bar 120 moves the pins 107, 124 and 106 to the predetermined positions, that is, the relative positions of the punch-holes 52A, 52B and 52C and the image area of the negative film 12 obtained at the calculating station 58.

By this movement, for example, the stepping motor 70 is driven to move the pin 124 to the relative position of the punch-hole 52B in the direction of Y, In addition, the stepping motor 92 is driven to move the pin 106 to the relative position of the punch-hole 52C in the direction of X. The stepping motor 93 is driven to move the pin 107 to the relative position of the punch-hole 52A in the direction of X. Thereafter, each of the pins 107, 124 and 106 is inserted into the respective punch-holes 52A, 52B and 52C of the film 12 to register the image area of the negative film 12 at the predetermined position.

After the negative film 12 is registered at the predetermined position of the PS plate 14, the image of the negative film 12 is printed onto the PS plate 14. The PS plate 14 and the negative film 12 are discharged from the printing station 22. After the negative film 12 is delivered into the storing station 24, the pin bar 120 is returned to the predetermined position by means of the encoders 72, 94 and 95. Thereafter, when the next negative film 12 is fed to the printing station 22 for printing the image, a similar operation is repeated. At this time, when the printing operation is carried out at the printing station 22, the reference position is set at the punch-hole measuring station 18. The relative position of the reference position is evaluated at the calculating station 58 until the negative film 12 is fed to the printing station 22, so that the pin bar 120 is moved to match with the positions.

According to the present embodiment, positioning of the negative film 12 on the PS plate 14 is conducted based on measured results obtained in advance. If, at this time, the positioning is conducted by considering the dimension of a positioning error of the printing apparatus for printing plate 10 then the dimension of a positioning error of the printing apparatus for printing plate 10 can be substantially eliminated.

Incidentally, in the present embodiment, the punch-hole measuring station 18 is provided at the printing unit for printing plate 10, and the plurality of punch-holes 52A, 52B and 52C are punched through the negative film 12 so that they may serve as the reference positions. However, the present invention is not restricted to the same. One side of the negative film 12 adjacent to one angle thereof may be used as the reference position for positioning. Namely, one angle and one side of the negative film 12 placed on the surface plate 44 may be held as the reference positions to read the positions of the register marks 30A, 30B and 30C. In this case, it is natural that the one angle and one side of the negative film 12 serve as the reference positions at the printing station 22 also.

In addition, although in the present embodiment the printing apparatus for printing plate 10 for printing the image recorded on the negative film 12 onto the PS plate 14 was described, the present invention is not necessarily limited to the same. The present invention is also applicable to a printing apparatus in which the image recorded on the film is printed by positioning at the predetermined position of a photosensitive material.

For example, in a check plate preparing apparatus in a color print, the present invention is applicable to positioning the color image. In addition, it is also applicable to positioning the image in an automatic plate setting machine or the like. In addition, the film may of course be positive film. As the PS plate, either the negative film or positive film may be used.

As described above, according to the photosensitive material printing apparatus of the present invention, since the film is not registered after being loaded into the printing portion, the working time at the printing portion of the apparatus can be shortened. In addition, since positioning can be conducted by correcting according to dimension of a positioning error of apparatus, it is possible to substantially eliminate the dimension of a positioning error between a plurality of photosensitive material printing apparatuses. Further, in the positioning apparatus according to the present invention, the positioning pin can be freely moved in a predetermined plane by means o f the first and second shifting means.

Consequently, a superior effect results in that positioning of the photosensitive material can be easily achieved.

What is claimed is:

1. A photosensitive material printing apparatus for printing an image recorded on an original film onto a photosensitive material in which the original film, having an image area indicating mark for indicating the area of the image recorded on said film, is registered on the photosensitive material such that said image area indicating mark corresponds to a predetermined position of the photosensitive material, said printing apparatus comprising:

reference position marking means for marking a reference position in said film;

reading means for reading the position of said image area indicating mark to obtain a relative position between said image area indicating mark and said reference position; and film positioning means for moving and holding said film to and at a position where the image area indicating mark corresponds to the predetermined position of the photosensitive material, according to the relative position obtained by said reading means.

2. A photosensitive material printing apparatus according to claim 1, wherein said reading means comprises means for detecting said image area indicating mark while being moved to read the position of said image area indicating mark, after said reference position has been marked by said reference position marking means.

3. A photosensitive material printing apparatus according to claim 2, wherein said reference position marking means comprises a punching member for marking said reference position by punching punch-holes in said film.

4. A photosensitive material printing apparatus according to claim 3, wherein said reading means reads the relative position between said punch-holes which constitute reference position marks, and said image area indicating mark.

5. A photosensitive material printing apparatus according to claim 1, wherein said film positioning means comprises a holding member to hold said film at said reference position.

6. A photosensitive material printing apparatus according to claim 5, wherein said reference position marking means comprises a punching member for punching punch-holes in said film, said punch-holes constituting reference position marks.

7. A photosensitive material printing apparatus according to claim 6, wherein said holding member includes pins, said pins being inserted into said punch-holes so that said film is coupled to said holding member.

8. A photosensitive material printing apparatus according to claim 1, further comprising:

film conveying means for conveying said film from a punching and measuring station at which said reading means is located, to a printing station, said film positioning means being positioned at said printing station.

9. A photosensitive material printing apparatus according to claim 1, further comprising:

calculating means for calculating a relative position between said reference position and said image area indicating mark, and correcting means for correcting a value calculated by said calculating means on the basis of the information of dimensional individualities of said apparatus.

10. A positioning device in which an original film, having an image area indicating mark for indicating an area of an image which has been recorded thereon and through holes constituting reference positions, is moved such that said image area indicating mark corresponds to a predetermined position of a photosensitive material, said positioning device comprising:

at least two pins disposed at predetermined positions, said film being held by inserting said pins into said through holes of said film;

first moving means for simultaneously moving said at least two pins in a same direction;

second moving means for moving said at least two pins independently of each other in a direction perpendicular to the direction of movement of said at least two pins moved by said first moving means; and means for maintaining a predetermined distance between said at least two pins as said at least two pins are being moved by said second moving means, wherein the film and the photosensitive material are registered such that said image area indicating mark corresponds to said predetermined position of said photosensitive material by moving said first moving means and said second moving means by means of said at least two pins.

11. A positioning device according to claim 10, wherein said second moving means includes means for moving said at least two pins in the same direction and in directions opposite to each other.

12. A photosensitive material printing apparatus for printing an image recorded on an original film onto a photosensitive material in which the original film, having an image area indicating mark for indicating the area of the image recorded on said film, is registered on the photosensitive material such that said image area indicating mark corresponds to a predetermined position of the photosensitive material, said printing apparatus comprising:

punching means for punching punch-holes in said film;

reading means for reading the position of said image area indicating mark to obtain the relative position between said image area indicating mark and said punch-holes;

film positioning means for moving and holding said film, to and at a position where the image area indicating mark corresponds to the predetermined position of the photosensitive material, according to the relative position obtained by said reading means; and film conveying means for conveying said film from a punching and measuring station at which said reading means is located to a printing station at which said film positioning means is located.

13. A photosensitive material printing apparatus according to claim 12, wherein said reading means includes means for detecting said image area indicating mark while said image area indicating mark is being moved, after said punch-holes have been punched by said punching means, and for determining the position of said image area indicating mark.

14. A photosensitive material printing apparatus according to claim 13, wherein said film positioning means comprises a holding member for holding said punch-holes in the film formed by said punch-hole punching means to register said film at a predetermined position.

15. A photosensitive material printing apparatus according to claim 14, wherein said holding member comprises at least two pins inserted into said punch-holes of said film to hold said film.

16. A photosensitive material printing apparatus according to claim 15, wherein said film positioning means comprises first moving means for simultaneously moving said at least two pins in a same direction.

17. A photosensitive material printing apparatus according to claim 16, wherein said film positioning means comprises second moving means for moving said at least two pins in the same direction and in the directions opposite to each other independently in the direction perpendicular to the direction of at least said two pins moved by said first moving means.

18. A photosensitive material printing apparatus according to claim 17, wherein said film positioning means includes means for maintaining a predetermined space between said at least two pins as said at least two pins are being moved by said second moving means.

19. A photosensitive material printing apparatus according to claim 12, further comprising:

calculating means for calculating a relative position between said punch-holes and said image area indicating mark, and correcting means for correcting a value calculated by said calculating means on the basis of the information of dimensional individualities of said apparatus.

20. A photosensitive material printing apparatus according to claim 1, wherein as a first original film is loaded into a printing station, the reference position of a second original film is marked by said reference position marking means and the position of the image area indicating mark of the second original film is read by said reading means.

21. A photosensitive material printing apparatus according to claim 12, wherein as a first original film is loaded into a printing station, the reference position of a second original film is marked by said reference position marking means and the position of the image area indicating mark of the second original film is read by said reading means.

22. A method of printing an image recorded on an original film onto a photosensitive material in which the original film, having an image area indicating mark for indicating the area of the image recorded on said film, is registered on the photosensitive material such that said image area indicating mark corresponds to a predetermined position of the photosensitive material, said method comprising the steps of:

marking a reference position in said film;

detecting the position of said image area indicating mark to determine a relative position between said image area indicating mark and said reference position; and moving said film to a position and holding said film at said position at which the image area indicating mark corresponds to the predetermined position of the photosensitive material, according to the determined relative position, wherein as a first original film is loaded into a printing station, the reference position of a second original film is marked and the position of the image area indicating mark of the second original film is read.

23. A method for positioning an original film, having an image area indicating mark for indicating an area of an image which has been recorded thereon and through holes constituting reference positions, is moved such that said image area indication mark corresponds to a predetermined position of a photosensitive material, said method comprising the steps of:

disposing at least two pins at predetermined positions;

holding said film by inserting said at least two pins into said through holes of said film;

simultaneously moving said at least two pins in a first direction;

moving said at least two pins independently of each other in directions perpendicular to said first direction;

maintaining a predetermined distance between said at least two pins as said at least two pins are being moved in said directions perpendicular to said first direction; and registering the film and the photosensitive material such that said image area indicating mark corresponds to said predetermined position of said photosensitive material by moving said at least two pins in said first direction and said directions perpendicular to said first direction.

24. A method of printing an image recorded on an original film onto a photosensitive material in which the original film, having an image area indicating mark for indicating the area of the image recorded on said film, is registered on the photosensitive material such that said image area indicating mark corresponds to a predetermined position of the photosensitive material, said method comprising the steps of:

punching punch-holes in said film;

reading the position of said image area indicating mark to obtain the relative position between said image area indicating mark and said punch-holes;

moving said film to a position and holding said film at said position where the image area indicating mark corresponds to the predetermined position of the photosensitive material, according to the relative position obtained; and conveying said film from a punching and measuring station at which said position of said image area indicating mark is read to a printing station at which said film is positioned and held.

* * * * *